United States Patent
Pedron et al.

(10) Patent No.: US 6,940,154 B2
(45) Date of Patent: Sep. 6, 2005

(54) INTEGRATED CIRCUIT PACKAGE AND METHOD OF MANUFACTURING THE INTEGRATED CIRCUIT PACKAGE

(75) Inventors: Serafin Pedron, Manteca, CA (US); Neil Robert McLellan, Mid Levels (HK); Lin Tsui Yee, Tung Tau Estate (HK)

(73) Assignee: ASAT Limited, Tsuen Wan (HK)

( * ) Notice: Subject to any disclaimer, the term of this patent is extended or adjusted under 35 U.S.C. 154(b) by 83 days.

(21) Appl. No.: 10/178,372

(22) Filed: Jun. 24, 2002

(65) Prior Publication Data

US 2003/0234454 A1 Dec. 25, 2003

(51) Int. Cl.⁷ ............................................. H01L 23/495
(52) U.S. Cl. ........................ 257/666; 257/786; 257/781; 257/784
(58) Field of Search ................................ 257/666, 781, 257/784, 786

(56) References Cited

U.S. PATENT DOCUMENTS

| | | |
|---|---|---|
| 3,908,075 A | 9/1975 | Jackson et al. |
| 3,942,245 A | 3/1976 | Jackson et al. |
| 4,501,960 A | 2/1985 | Jouvet et al. |
| 4,674,175 A | 6/1987 | Stampfli |
| 4,701,781 A | 10/1987 | Sankhagowit |
| 4,975,765 A | 12/1990 | Ackermann et al. |
| 5,023,202 A | 6/1991 | Long et al. |
| 5,041,395 A | 8/1991 | Steffen |
| 5,122,860 A | 6/1992 | Kikuchi et al. |
| 5,157,475 A | 10/1992 | Yamaguchi |
| 5,172,213 A | 12/1992 | Zimmerman |
| 5,175,612 A | 12/1992 | Long et al. |
| 5,221,642 A | 6/1993 | Burns |
| 5,273,938 A | 12/1993 | Lin et al. |
| 5,285,105 A | 2/1994 | Cain |

(Continued)

FOREIGN PATENT DOCUMENTS

| | | |
|---|---|---|
| FR | 2 609 841 | 1/1987 |
| JP | 3-198368 | 8/1991 |

OTHER PUBLICATIONS

US 5,905,304, 5/1999, Ewer et al. (withdrawn)
English Translation of JP Laid Open Patent Application No. 3–198368 (3 pages).

(Continued)

*Primary Examiner*—Jasmine J Clark
(74) *Attorney, Agent, or Firm*—Milbank, Tweed, Hadley & McCloy

(57) ABSTRACT

The present invention relates to an integrated circuit package and method of manufacturing an integrated circuit package. In one aspect, the present invention relates to an integrated circuit package including a lead frame having a lead with an inner pad and an outer pad connected by a connection member, wherein a region of the inner pad and a region of the outer pad are separated by a channel extending through a width of the lead. Such an integrated circuit package further includes a semiconductor die electrically coupled with the inner pad of the lead, and an encapsulant material encapsulating at least a portion of said lead frame, wherein a portion of said outer pad is exposed. In another aspect, the present invention relates to a method including providing a matrix of lead frames, each of the lead frames having a lead, forming a channel extending through a width of the lead to create an inner pad, an outer pad and a connection member in the lead, electrically coupling a semiconductor die with the inner pad, and encapsulating at least a portion of the lead frame such that at least a portion of the outer pad is exposed.

99 Claims, 11 Drawing Sheets

U.S. PATENT DOCUMENTS

| | | | |
|---|---|---|---|
| 5,334,857 A | 8/1994 | Mennitt et al. | |
| 5,366,933 A | 11/1994 | Golwalkar et al. | |
| 5,420,460 A | 5/1995 | Massingill | |
| 5,474,957 A | 12/1995 | Urushima | |
| 5,482,736 A | 1/1996 | Glenn et al. | |
| 5,482,898 A | 1/1996 | Marrs | |
| 5,485,037 A | 1/1996 | Marrs | |
| 5,556,807 A | 9/1996 | Bhattacharyya et al. | |
| 5,596,231 A | 1/1997 | Combs | |
| 5,596,485 A | 1/1997 | Glenn et al. | |
| 5,620,928 A | 4/1997 | Lee et al. | |
| 5,672,909 A | 9/1997 | Glenn et al. | |
| 5,679,978 A | 10/1997 | Kawahara et al. | |
| 5,693,572 A | 12/1997 | Bond et al. | |
| 5,769,589 A | 6/1998 | Lubbers | |
| 5,796,163 A | 8/1998 | Glenn et al. | |
| 5,801,927 A * | 9/1998 | Watanabe | 361/777 |
| 5,847,455 A | 12/1998 | Manteghi | |
| 5,854,511 A | 12/1998 | Shin et al. | |
| 5,867,368 A | 2/1999 | Glenn | |
| 5,886,397 A | 3/1999 | Ewer | |
| 5,894,108 A | 4/1999 | Mostafazadeh et al. | |
| 5,900,676 A | 5/1999 | Kweon et al. | |
| 5,903,052 A | 5/1999 | Chen et al. | |
| 5,939,784 A | 8/1999 | Glenn | |
| 5,949,655 A | 9/1999 | Glenn | |
| 5,950,074 A | 9/1999 | Glenn et al. | |
| 5,962,810 A | 10/1999 | Glenn | |
| 5,973,388 A * | 10/1999 | Chew et al. | 257/676 |
| 5,981,314 A | 11/1999 | Glenn et al. | |
| 6,011,694 A | 1/2000 | Hirakawa | |
| 6,034,429 A | 3/2000 | Glenn et al. | |
| 6,040,984 A * | 3/2000 | Hirakawa | 361/777 |
| 6,081,029 A | 6/2000 | Yamaguchi | |
| 6,091,603 A | 7/2000 | Daves et al. | |
| 6,092,281 A | 7/2000 | Glenn | |
| 6,104,086 A | 8/2000 | Ichikawa et al. | |
| 6,117,193 A | 9/2000 | Glenn | |
| 6,117,705 A | 9/2000 | Glenn et al. | |
| 6,143,588 A | 11/2000 | Glenn | |
| 6,143,981 A | 11/2000 | Glenn | |
| 6,150,193 A | 11/2000 | Glenn | |
| 6,198,163 B1 | 3/2001 | Crowley et al. | |
| 6,201,292 B1 | 3/2001 | Yagi et al. | |
| 6,214,644 B1 | 4/2001 | Glenn | |
| 6,228,676 B1 | 5/2001 | Glenn et al. | |
| 6,229,200 B1 | 5/2001 | Mclellan et al. | |
| 6,236,568 B1 | 5/2001 | Lai et al. | |
| 6,239,496 B1 | 5/2001 | Asada | |
| 6,242,281 B1 | 6/2001 | Mclellan et al. | |
| 6,246,566 B1 | 6/2001 | Glenn | |
| 6,258,629 B1 | 7/2001 | Niones et al. | |
| 6,265,771 B1 | 7/2001 | Ference et al. | |
| 6,266,197 B1 | 7/2001 | Glenn et al. | |
| 6,274,927 B1 | 8/2001 | Glenn | |
| 6,281,241 B1 | 8/2001 | Elsner | |
| 6,281,568 B1 | 8/2001 | Glenn et al. | |
| 6,285,075 B1 | 9/2001 | Combs et al. | |
| 6,291,884 B1 | 9/2001 | Glenn et al. | |
| 6,294,100 B1 | 9/2001 | Fan et al. | |
| 6,294,830 B1 | 9/2001 | Fjelstad | |
| 6,307,755 B1 | 10/2001 | Williams et al. | |
| 6,326,678 B1 | 12/2001 | Karnezos et al. | |
| 6,395,578 B1 | 5/2002 | Shin et al. | |
| 6,396,143 B1 | 5/2002 | Kimbara et al. | |
| 6,429,048 B1 | 8/2002 | McLellan et al. | |
| 6,429,508 B1 * | 8/2002 | Gang | 257/678 |
| 6,433,360 B1 | 8/2002 | R. Dosdos et al. | |
| 6,444,498 B1 | 9/2002 | Huang et al. | |
| 6,452,255 B1 * | 9/2002 | Bayan et al. | 257/666 |
| 6,458,626 B1 | 10/2002 | Huang et al. | |
| 6,498,099 B1 | 12/2002 | McLellan et al. | |
| 6,507,102 B2 | 1/2003 | Juskey et al. | |
| 6,545,347 B2 * | 4/2003 | McClellan | 257/690 |
| 6,552,417 B2 | 4/2003 | Combs | |
| 6,566,740 B2 * | 5/2003 | Yasunaga et al. | 257/670 |
| 6,638,790 B2 * | 10/2003 | Minamio et al. | 438/111 |
| 2002/0079570 A1 | 6/2002 | Ho et al. | |

OTHER PUBLICATIONS

English Translation of French Publication No. 2 609 871 (14 pages).

U.S. Appl. No. 09/902,878 filed Jul. 11, 2001 by Combs et al.

U.S. Provisional Appl. No. 60/312,411 filed Aug. 15, 2001 by McLellan et al.

U.S. Appl. No. 10/062,650 filed Jan. 31, 2002 by McLellan et al.

U.S. Appl. No. 10/062,896 filed Jan. 31, 2002 by Pedron et al.

U.S. Appl. No. 10/104,263 filed Mar. 22, 2002 by Combs et al.

* cited by examiner

SINGULATION

INTEGRATED CIRCUIT PACKAGE AND METHOD OF MANUFACTURING THE INTEGRATED CIRCUIT PACKAGE

FIELD OF THE INVENTION

The present invention relates to integrated circuit packaging technology, and more particularly, to lead frames, integrated circuit packages, and methods of manufacturing such lead frames and packages.

BACKGROUND OF THE INVENTION

A conventional lead frame may include a die attachment pad for accommodating a semiconductor die, as well as a number of leads connected to the semiconductor die. Such a conventional lead frame and semiconductor die may be packaged by being encapsulated within a plastic or resinous material. Various shapes and sizes of such packages exist. For example, U.S. Pat. No. 6,229,200 to Mclellan, entitled "Saw-Singulated Leadless Plastic Chip Carrier," discloses a chip carrier having an encapsulation encapsulating a semiconductor die. In certain standard and conventional lead frames, the leads connected to the semiconductor die may be spaced somewhat far from the semiconductor die's bonding pads when the die is of a relatively small size compared to the lead frame. Therefore, in connection with certain packages, it may be advantageous to have a lead frame which includes a portion of a lead for attachment to the semiconductor die, and another portion of the lead for connection to an external device.

SUMMARY OF THE INVENTION

In one aspect, the invention features an integrated circuit package including a lead frame with a lead having an inner pad and an outer pad connected by a connection member, wherein a region of the inner pad and a region of the outer pad are separated by a channel extending through a width of the lead, a semiconductor die electrically coupled with the inner pad of the lead, and an encapsulant material encapsulating at least a portion of the lead frame, wherein a portion of the outer pad is exposed.

In another aspect, the invention features an integrated circuit package including a lead frame having a die attachment pad and a plurality of inwardly projecting leads, each of the leads having an inner pad and an outer pad, wherein a region of the inner pad and a region of the outer pad is separated by a channel extending through a width of the lead and connected by a connection member integral with the inner pad and the outer pad, the connection member having a thickness that is approximately half a thickness of the lead, a semiconductor die electrically coupled with the inner pad of the lead, and an encapsulant material encapsulating at least a portion of the lead frame, wherein a portion of the outer pad is exposed.

In yet another aspect, the invention features a method including providing a matrix of lead frames, each of the lead frames having a lead, forming a channel extending through a width of the lead to create an inner pad, an outer pad and a connection member in the lead, electrically coupling a semiconductor die with the inner pad, and encapsulating at least a portion of the lead frame such that at least a portion of the outer pad is exposed.

In a further aspect, the invention features a method including providing a lead frame having a lead, forming a channel extending through a width of the lead to create an inner pad, an outer pad and a connection member in the lead, electrically coupling a semiconductor die with the inner pad, and encapsulating at least a portion of the lead frame such that at least a portion of the outer pad is exposed.

BRIEF DESCRIPTION OF THE DRAWINGS

The foregoing features, methods and other aspects of the invention are explained in the following description taken in connection with the accompanying drawings, wherein.

It is to be understood that the drawings are exemplary, and are not to be deemed limiting to the full scope of the appended claims.

DETAILED DESCRIPTION OF PREFERRED EMBODIMENTS

Various embodiments of devices according to the present invention will now be described with reference to the drawings.

Figure 1:
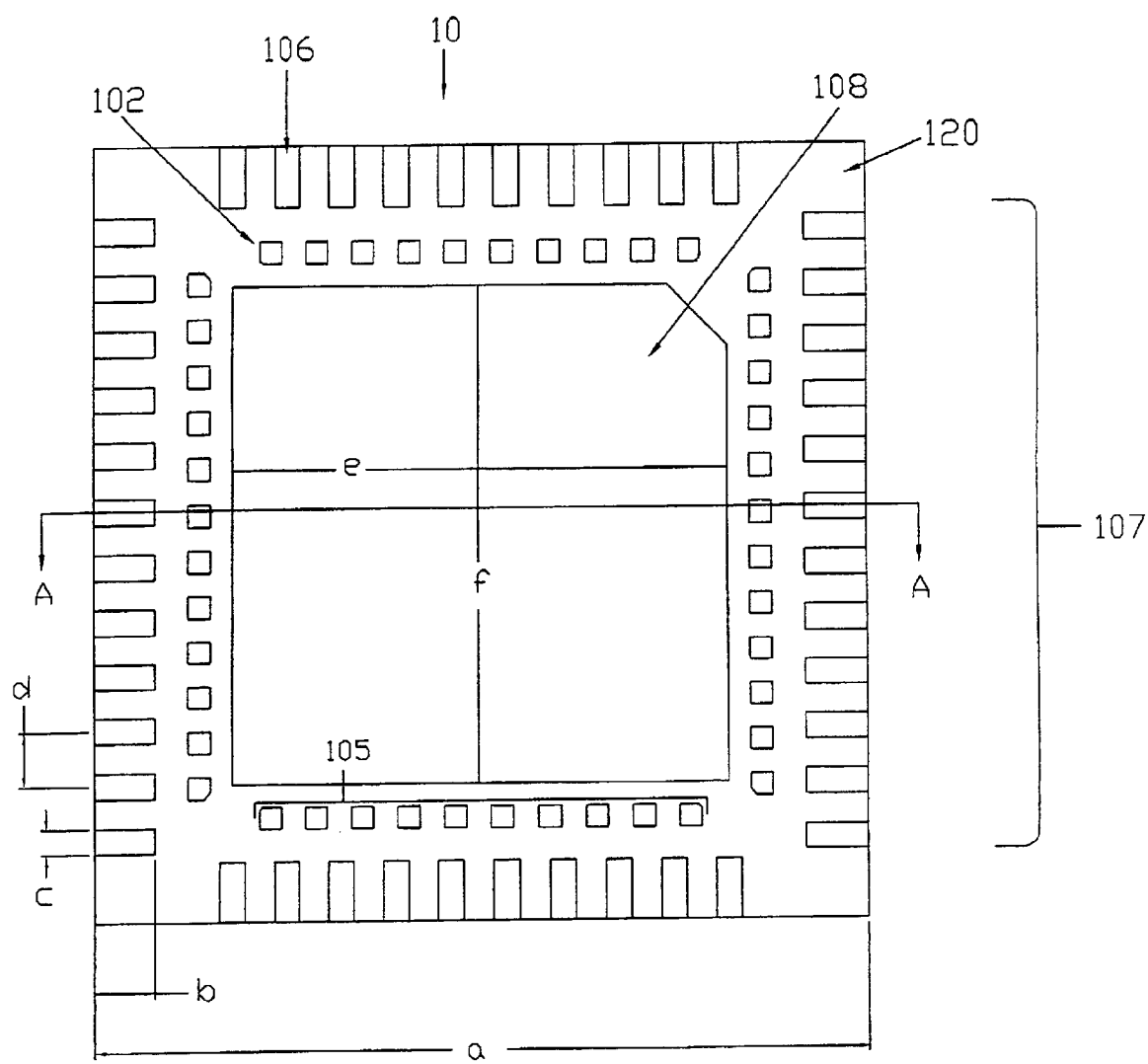
FIG. 1 shows a bottom view of an integrated circuit package 10 according to one embodiment of the present invention.

FIG. 1 is a bottom view of an integrated circuit package 10 according to one embodiment of the present invention. Inner lead pads 102, outer lead pads 106 and a die attachment pad 108 of a lead frame 101 are shown exposed to the environment. Also shown is an encapsulant material 120 encapsulating certain internal portions of the integrated circuit package 10. The encapsulant 120 may be configured such that certain bottom surfaces of the die attachment pad 108 and the leads 101 are exposed.

In one embodiment, the lead frame 100 may have inner rows 105 of inner lead pads 102 arranged in a generally annular configuration, and outer rows 107 of outer lead pads 106 arranged in a generally annular configuration. The pitch between adjacent inner lead pads 102 and adjacent out lead pads 106 of a lead frame 100 of one embodiment may be different. As shown in the embodiment depicted in FIG. 1, the inner lead pads 102 of an inner row 105 of pads may be more closely spaced in relation to one another than the outer lead pads 106 of an outer row 107 of pads. Moreover, an inner lead pad 102 may have a smaller footprint or planform area than a corresponding outer lead pad 106. In such an embodiment, the outer lead pads 106 may conform to a standard leadless plastic chip carrier configuration, while the inner lead pads 102 may be configured to more closely match the placement and spacing of bonding pads 112 of the semiconductor die 110.

The lead frame 100 may also include a die attachment pad 108 onto which a semiconductor die 110 may be attached. In such an embodiment, a soft solder may be used to attach the semiconductor die 110 to the die attachment pad 108, which may provide improved thermal performance.

Certain example dimensions are also depicted in FIG. 1. As shown in FIG. 1, each inner lead pad 102 may be smaller than its corresponding outer lead pad 106. In one embodiment, the width of a package 10 (shown as dimension "a") may be about 7.000 mm, the length of an outer lead pad 106 (shown as dimension "b") may be about 0.550 mm, each outer lead pad 106 may be about 0.230 mm wide (shown as dimension "c"), the pitch (shown as dimension "d") of adjacent outer lead pads 106 may be approximately 0.500 mm, and inner dimensions "e" and "f" may be about 4.300 mm.

Figure 2:
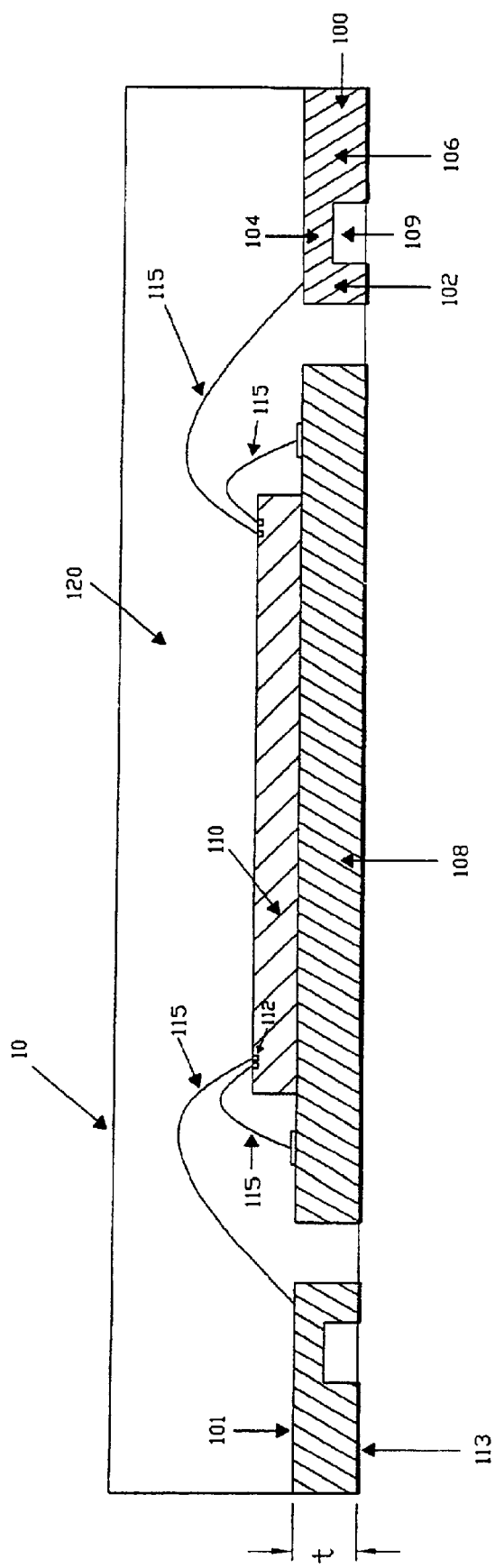
FIG. 2 is a simplified cross-sectional view, along line A—A, of the integrated circuit package 10 shown in FIG. 1.

FIG. 2 shows a cross-sectional view along line A—A of the integrated circuit package 10 shown in FIG. 1. This cross-sectional view shows certain components of the package 10 displayed in their respective positions relative to one another. One embodiment of an integrated circuit package 10 may generally include a lead frame 100, a semiconductor die 110 and an encapsulant 120.

The lead frame 100 of the integrated circuit package 10 of one embodiment may be made of an electrically conductive material such as, e.g., copper. However, the lead frame 100 may be made of other metals, electrically conductive materials, or electrically conductive compounds in accordance with other embodiments of the present invention. The lead frame 100 may provide, at least in part, interconnections between the power, input and/or output terminals of the semiconductor die 110 and any external terminals that may be provided on the integrated circuit package 10. FIG. 2 shows a semiconductor die 110 connected to the inner lead pads 102 of the lead frame 100 via, for example, a gold thermo-sonic wire bonding technique. In such an embodiment, conductive gold wires 115 may interconnect bonding pads 112 formed on a top surface of the semiconductor die 110 to the leads 101 of the lead frame 100. Each such wire 115 may be bonded to both a bonding pad 112 of the semiconductor die 110 at one end, and the corresponding inner lead pad 102 at the other end. Each inner lead pad 102 may be connected to a corresponding outer lead pad 106 by an integrally formed connection portion 104 which, in one embodiment, may have a thickness dimension which is approximately half of the total thickness dimension "t" of a lead 101. A chemical etching process may be used to form a channel 109 in the lead 101 to create the connection portion 104 of a particular lead 101.

In one embodiment, portions of the upper and lower surfaces of a lead frame 100 may be plated 113 with solder or pure tin (Sn). This solder or pure tin plating 113 may provide an interface surface for mechanical, electrical or both types of connection of the integrated circuit package 10 to an external device (not shown). Alternatively, the lead frame 100 may be pre-plated with palladium to avoid silver migration.

As is further shown in FIG. 2, the semiconductor die 110 and lead frame 100 may be encapsulated in connection with an integrated circuit package 10 according to one embodiment of the present invention. The encapsulant 120 may be, for example, an epoxy based material applied by, for example, a liquid encapsulation process or a transfer molding encapsulation process. The top surface of the encapsulation may be given a distinctive pattern, which can be conferred to the encapsulation from the molding cavity during the molding process. This pattern, (e.g., a dimple array) may be used to orient the package 10 after singulation.

Figure 3:
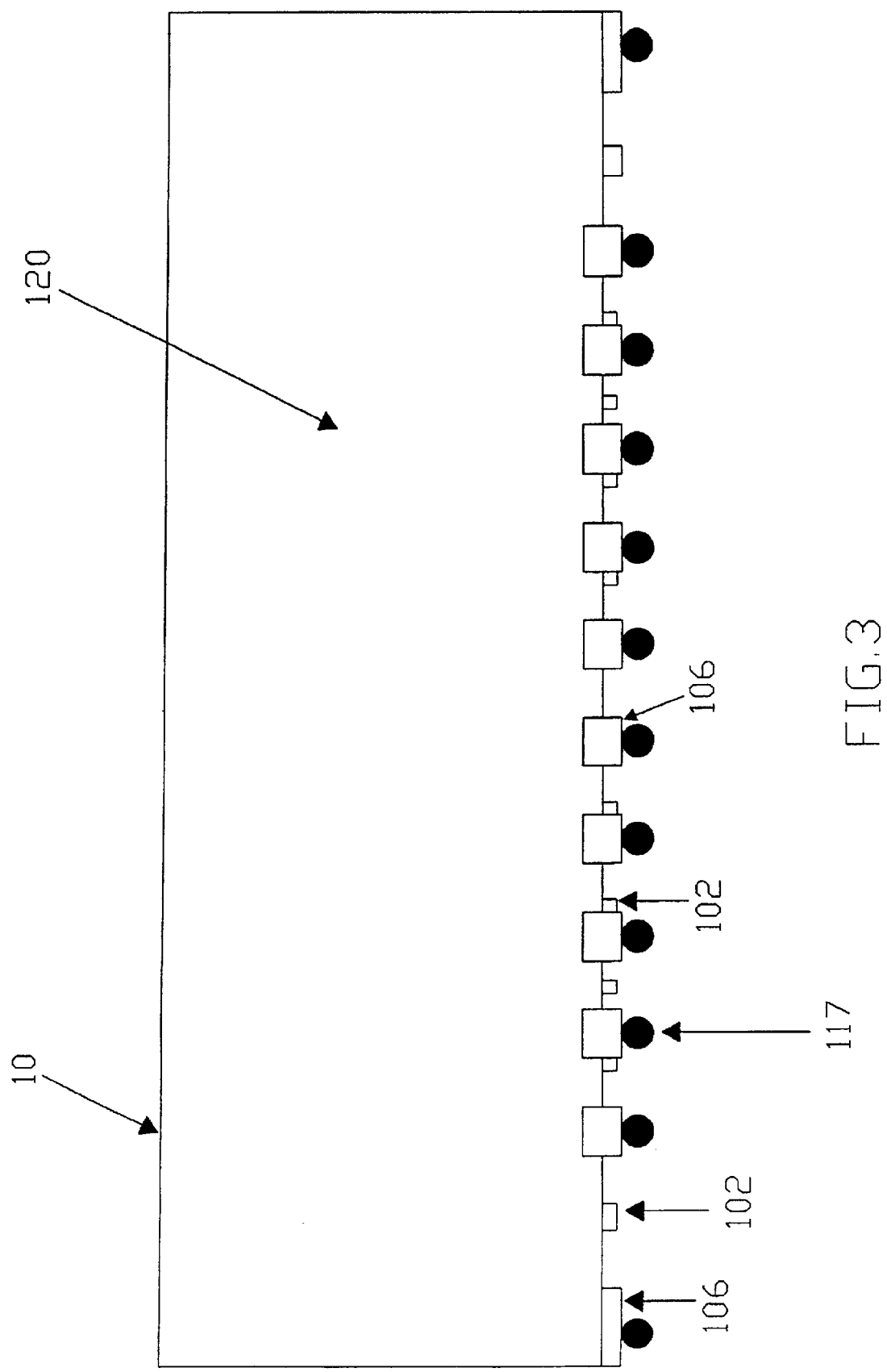
FIG. 3 is a side view of the integrated circuit package 10 shown in FIG. 1.

FIG. 3 is a side view of an example embodiment of an integrated circuit package 10 according to the present invention. As shown in FIG. 3, the external terminals of an integrated circuit package 10 may include an array of conductive members such as, e.g., solder balls 117. Such solder balls 117 may be attached to the outer lead pads 106 of the leads 101 using a reflow soldering process. In such an embodiment, the solder balls 117 function as electrical extensions of the leads 101, and may be capable of providing power, signal inputs and signal outputs to and from the semiconductor die 110. Such solder balls 117 may also provide clearance between the package 10 bottom and the printed circuit board (not shown) on which the package 10 is mounted. The solder balls 117 may be made of a variety of materials including lead (Pb) free solder. Such a configuration may be referred to as a type of ball grid array. Absent the solder balls 117, such a configuration may be referred to as a type of land grid array.

Figure 4:
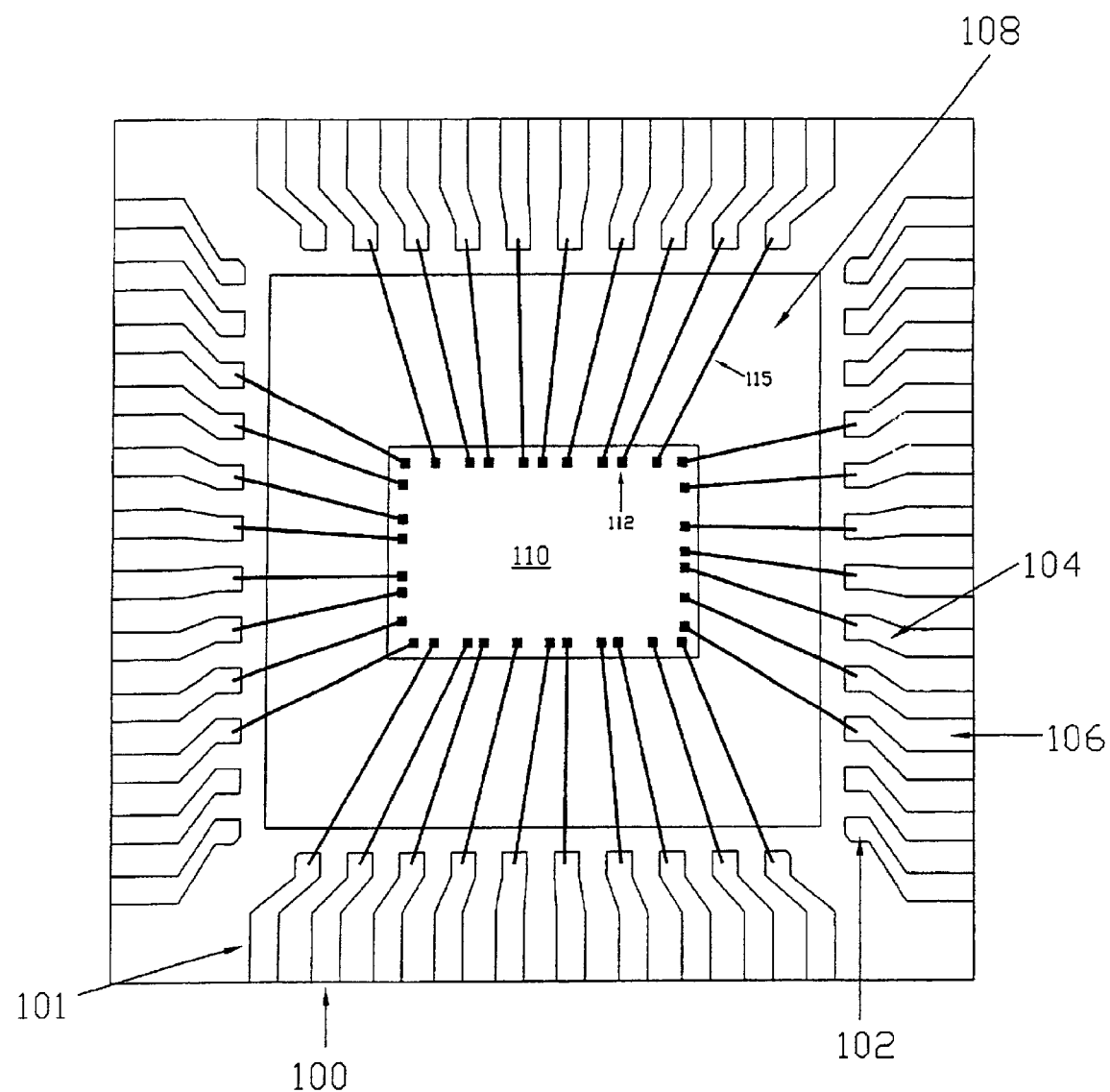
FIG. 4 is a top view of a lead frame pre-assembly of the integrated circuit package 10 shown in FIG. 1.

FIG. 4 depicts a top view of a lead frame 100 and semiconductor die 110 prior to encapsulation. As shown, a semiconductor die 110 is attached to the die attachment pad 108 of the lead frame 100, and the bonding pads 112 of the semiconductor die 110 are connected via wires 115 to the inner lead pads 102 of the leads 101. The bonding pads 112 may provide locations at which the semiconductor die 110 may receive power and/or input signals, as well as transmit output signals. The wires 115 are one way to electrically couple a semiconductor die 110 of an integrated circuit package 10 to the leads 101 of the package 10 such that the semiconductor die 110 may receive power, input signals and/or output signals. The configuration of inner lead pads 102 as shown in FIG. 4 may allow the semiconductor die 110 to be connected to the lead frame 100 using a shorter length of wire 115 than may otherwise be required.

Figure 5:
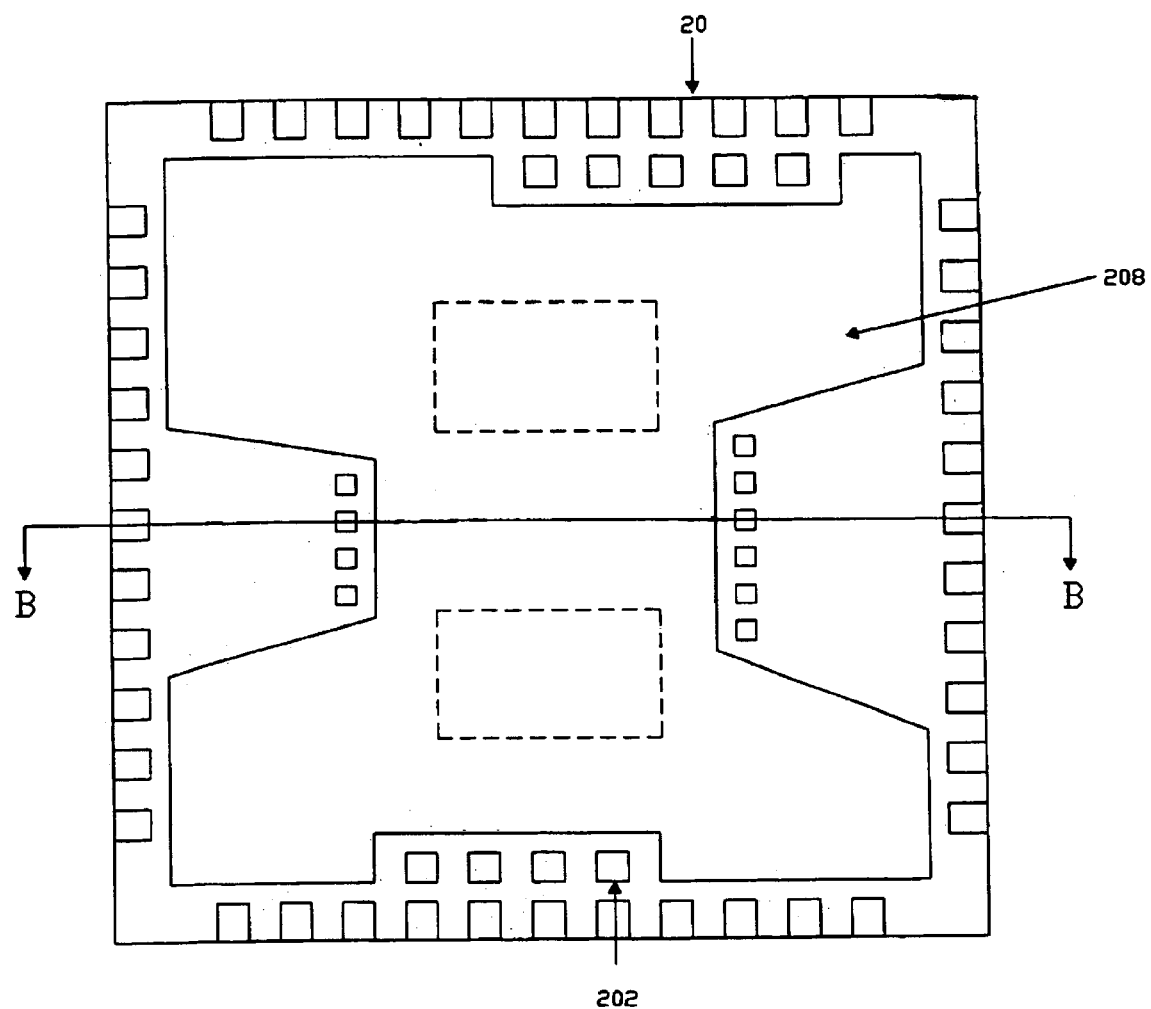
FIG. 5 shows a bottom view of an integrated circuit package 20 according to another embodiment of the present invention.

FIG. 5 shows a bottom view of an integrated circuit package 20 according to another embodiment of the present invention. In such an embodiment, the die attachment pad 208 may be shaped to accommodate the contours of inner lead pads 202 projecting inwardly from the periphery of the package 20.

Figure 6:
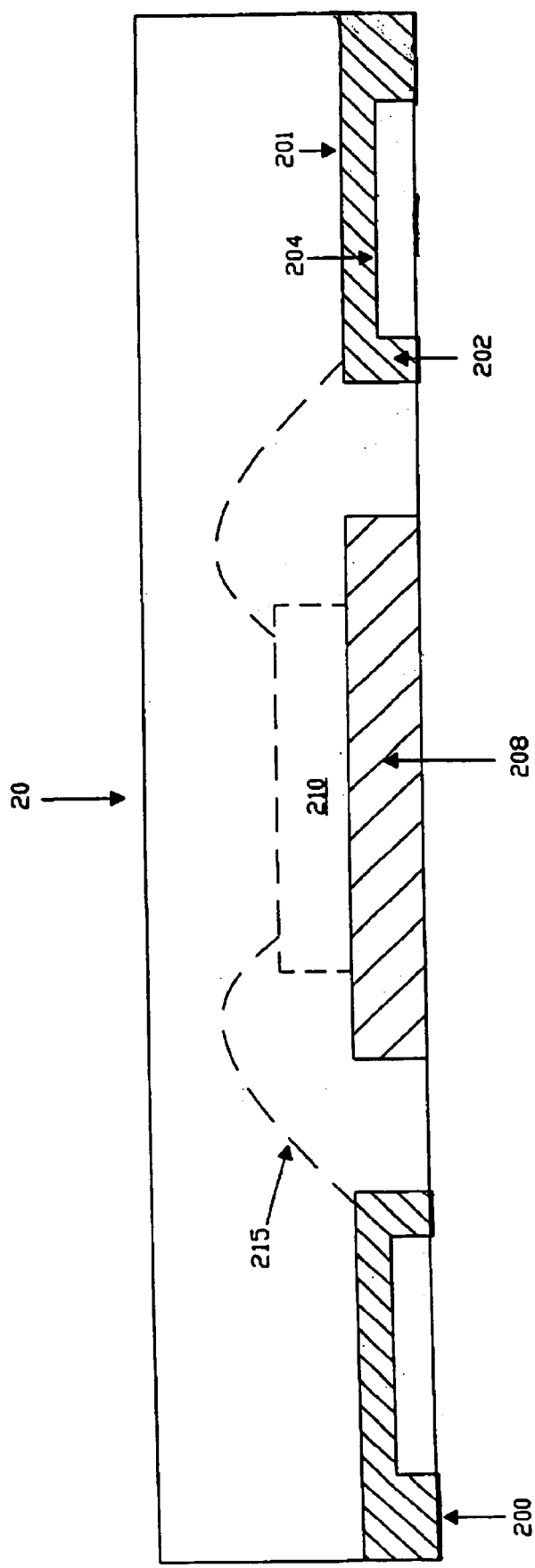
FIG. 6 is a simplified cross-sectional view, along line B—B, of the integrated circuit package 20 shown in FIG. 5.
Figure 7:
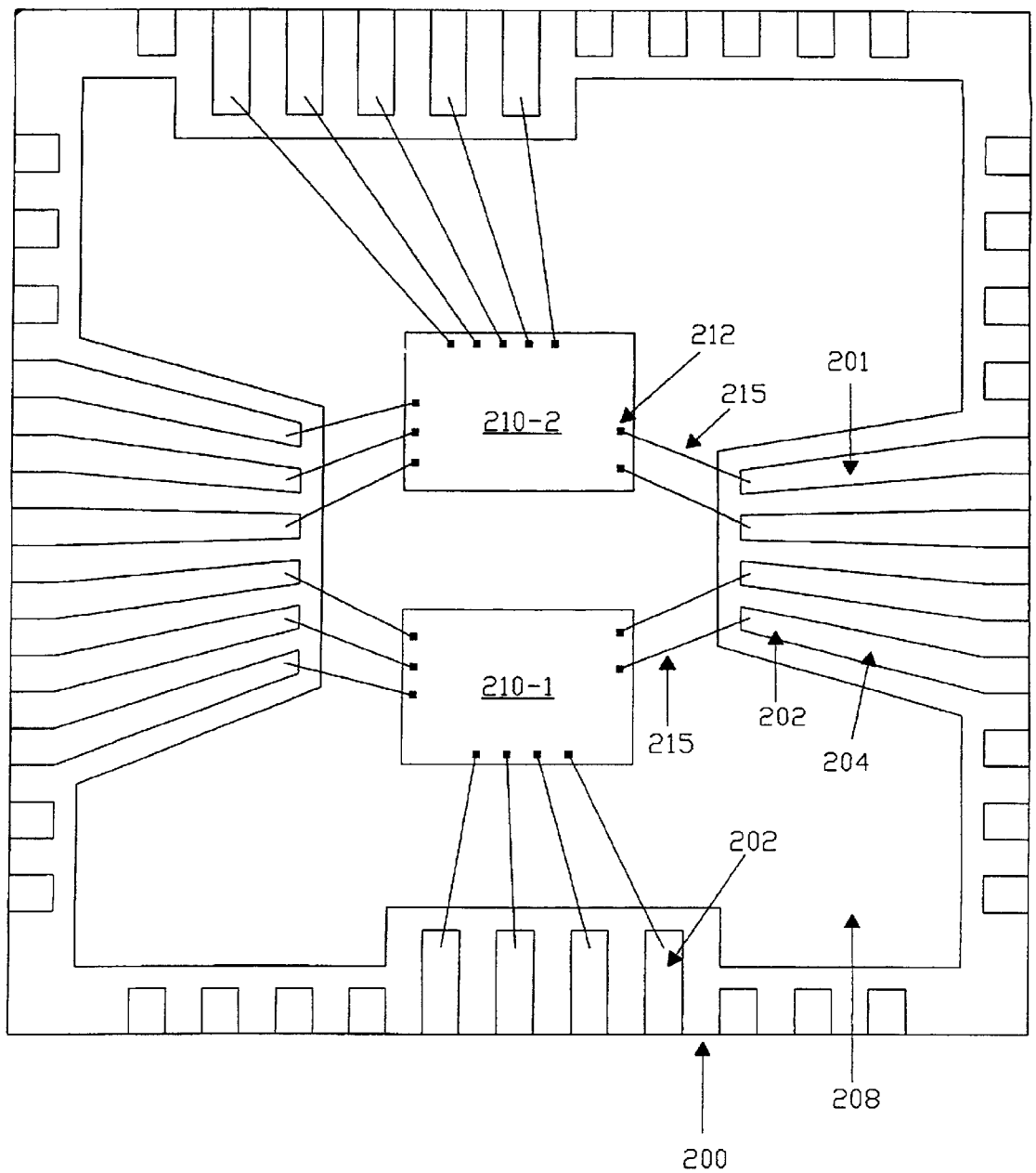
FIG. 7 is a top view of a lead frame pre-assembly of the integrated circuit package 20 shown in FIG. 5.

FIG. 6 shows a cross-sectional view along line B—B of the integrated circuit package 20 shown in FIG. 5. The integrated circuit package 20 generally includes a lead frame 200, one or more semiconductor dies 210 and an encapsulant 220. FIG. 7 depicts a top view of a lead frame 200 and semiconductor dies 210-1, 210-2 prior to encapsulation. A number of semiconductor dies 210-1, 210-2 may be attached to the die attachment pad 208. The configuration of inner lead pads 202 as shown in FIG. 7 may allow two semiconductor dies 210-1, 210-2 to be connected to the lead frame 200 using a shorter length of wire 215 than may otherwise be required. Conductive wires 215 may be bonded between bonding pads 212 on each semiconductor die 210-1, 210-2 and the inner lead pads 202 of the respective leads 201. In some cases, it may be desirable to position the inner lead pads 202 close to the semiconductor die 210. As shown, the connection portions 204 of certain leads 201 may be longer than others to allow certain inner lead pads 202 to be positioned more closely to bonding pads 212 of the semiconductor dies 210.

Figure 8:
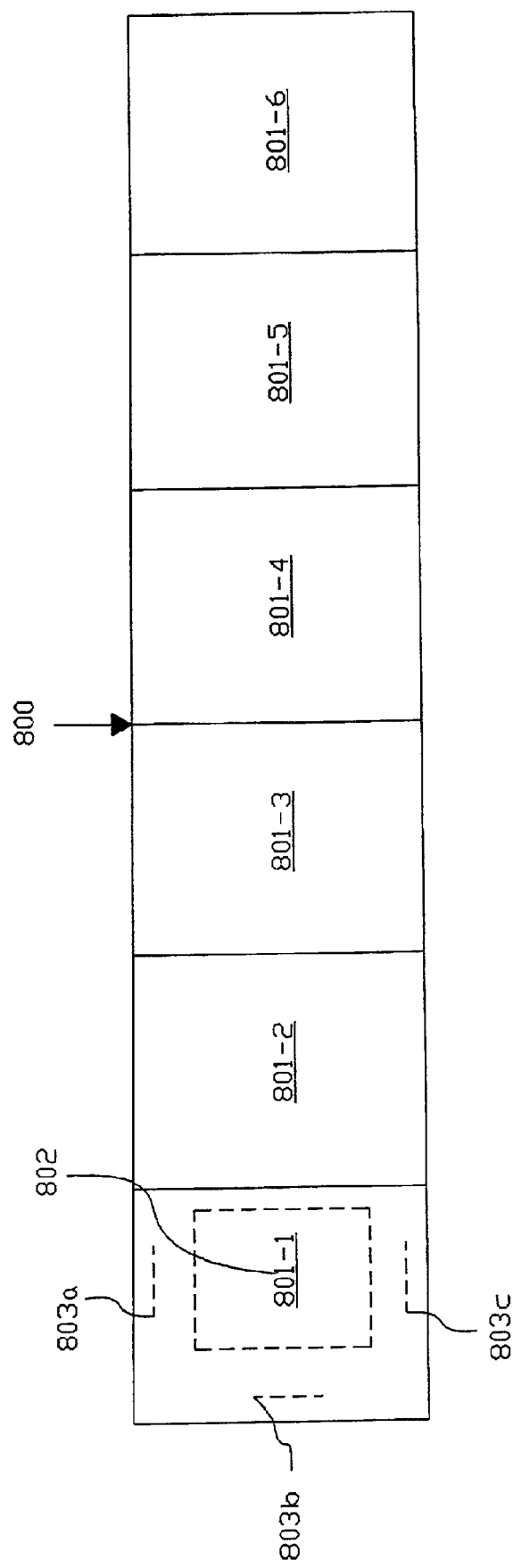
FIG. 8 shows a strip 800, including six sections 801-1 to 801-6, which may be used to make integrated circuit packages according to the present invention.
Figure 9:
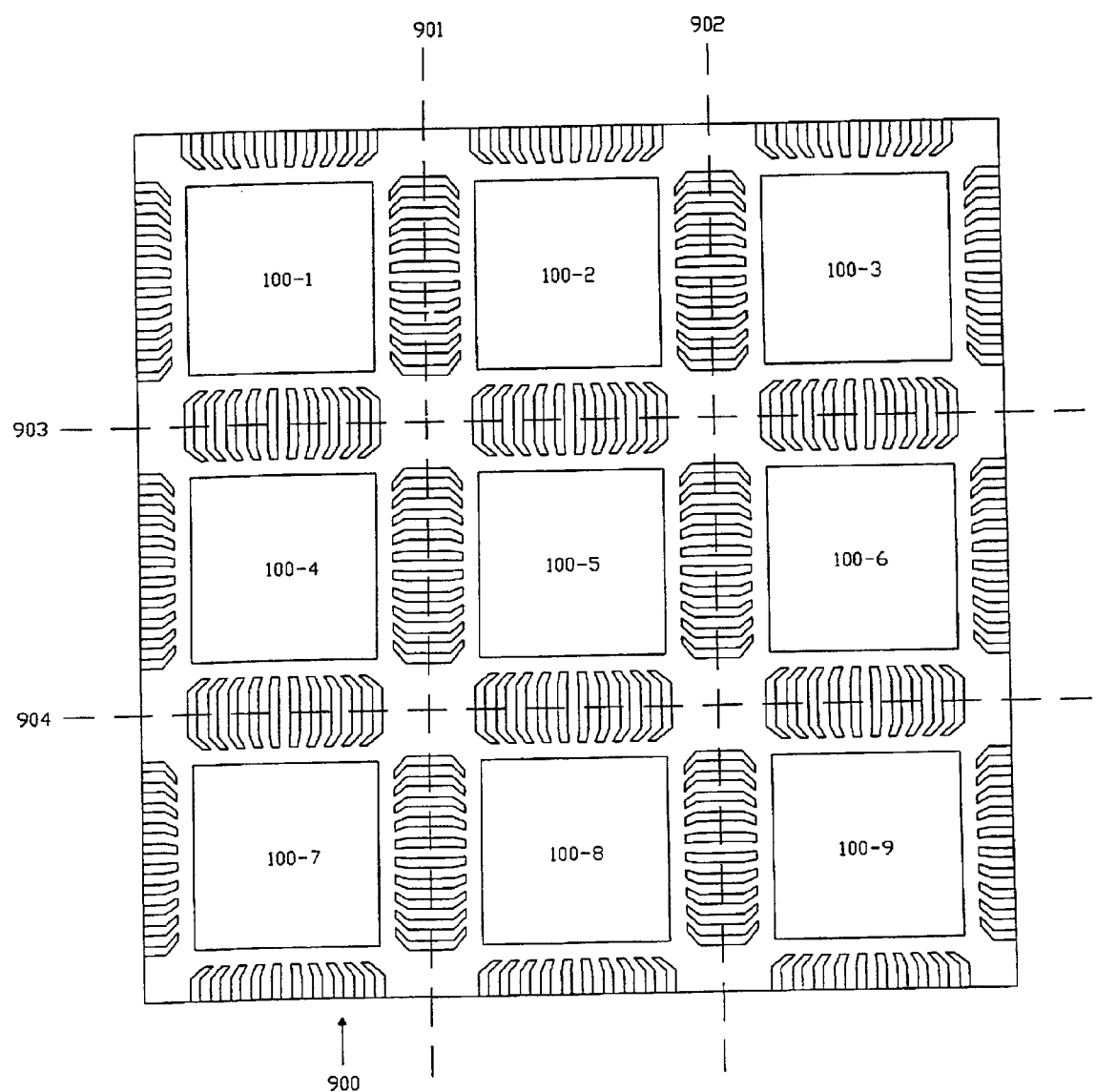
FIG. 9 shows a 3×3 array 900 of lead frames 100-1 to 100-9 which may be provided in one or more of the sections 801-1 to 801-6 of the strip 800.

According to certain embodiments, shown in FIGS. 8 and 9, a lead frame 100, 200 may be formed in a matrix 900 of substantially identical lead frames. Furthermore, the matrix 900 of lead frames may be formed as one of multiple matrices of lead frames formed in a metal strip 800.

FIG. 8 shows a strip 800 including six sections 801-1 to 801-6 which may be used to fabricate integrated circuit packages 10, 20 of the embodiments described above. Using such a strip 800 may allow an assembly process to be carried out in automated assembly equipment and molds. Several lead frames 100, 200 may be produced in the form of, or otherwise assembled into, the strip 800 shown in FIG. 8 to accommodate semiconductor manufacturing equipment and process flows. Each of sections 801-1 to 801-6 may include a frame area 802 in which lead frames such as the lead frames 100, 200 described above may be formed using, for example, a chemical etching process, a stamping process, a combination of these processes and/or other processes. For example, an array of lead frames, may be formed in the frame area 802, as shown in FIG. 9. The periphery of the frame area 802 may contain alignment targets, tooling through-holes and other assembly features (labeled, collectively, by reference numerals 803a–803c) for use in automated assembly equipment.

As shown in FIG. 9, several lead frames may also be configured in a matrix array 900. For example, the strip 800 shown in FIG. 8 may contain six substantially identical sections 801-1 to 801-6, each of which may contain a 3×3 matrix array 900 similar to that shown in FIG. 9, which shows nine lead frames. A matrix array 900 like the one shown in FIG. 9 may be formed in the frame area 802 of each section 801 of the strip 800. Thus, in one configuration, fifty-four lead frames may be formed in each strip 800. Other configurations of either the strip 800, the matrix array 900, or both, may produce other volumes of lead frames. FIG. 9 shows lines 901, 902, 903, 904 along which the lead frame 100 may be cut to form integrated circuit packages.

Methods of manufacturing embodiments of integrated circuit packages will now be described with reference to the drawings, in particular, FIGS. 10a–10j.

Figure 10A:
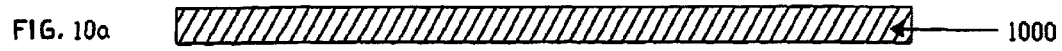
FIGS. 10a–10j show simplified cross-sectional views of certain steps of one type of process for making an integrated circuit package.
Figure 10B:
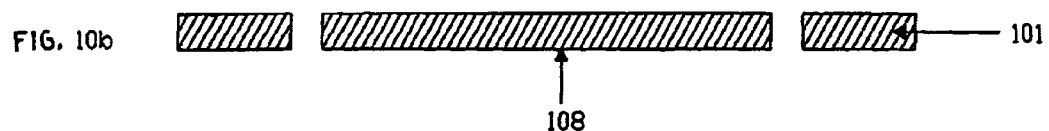

A lead frame 100 may be formed into the configuration shown in the figures by a number of different processes including a chemical process (e.g., etching), a mechanical process (e.g., metal stamping), or a combination of these and/or other processes. As represented in FIGS. 10a–10b, in one aspect of one method embodiment according to the present invention, a lead frame 100 may be stamped from a sheet 1000 of copper to create a die attachment pad 108 and leads 101. In such an example method of manufacture, a lead frame 100 may be stamped while it is a part of a matrix array 900 of lead frames.

Figure 10C:
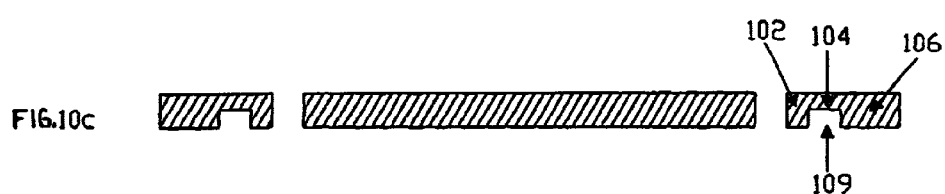

As depicted in FIG. 10c, after one or more lead frames 100 have been formed, an etching process may be used to etch a channel 109 into a bottom side of a lead 101 to create an inner lead pad 102, an outer lead pad 106 and a connection portion 104. In one method embodiment, a chemical etching process may be used to create the channel 109. For example, a chemical etching process may include masking the bottom portion of the outer lead pad 106 and inner lead pad 102 such that material from the lead 101 is removed to form the channel 109. In one method embodiment, the etching process may remove material from the lead 101 to create a channel 109 that is approximately half the thickness of the lead 101.

Figure 10D:
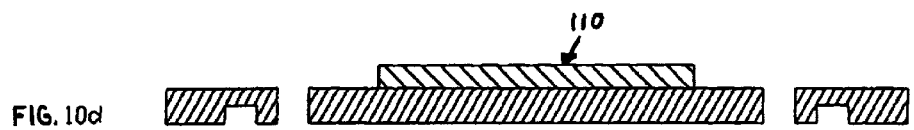

In one example manufacturing process, as shown in FIG. 10d, a semiconductor die 110 may be attached to a die attachment pad 108 of the lead frame 100. A semiconductor die 110 may be mounted or attached to the die attachment pad 108 by epoxy or any suitable adhesive or fastening material. The semiconductor die 110 may also be attached using a soft solder to provide thermal conductivity between the semiconductor die 110 and the die attachment pad 108, thereby improving the thermal performance of the resulting package.

Figure 10E:
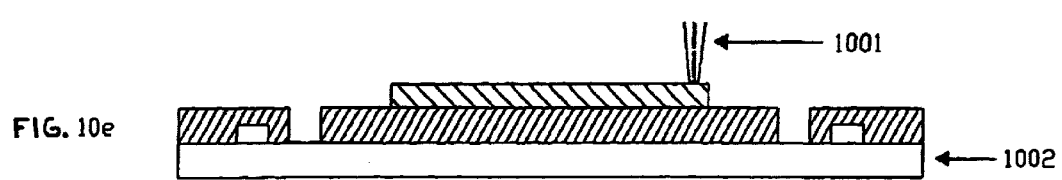
Figure 10F:
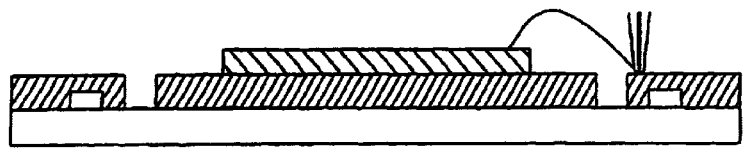
Figure 10G:

After the adhesive is cured, if required, the semiconductor die 110 may be wire-bonded to the inner lead pads 102 of the leads 101 using automated bonding equipment including a moving capillary device 1001 (see FIGS. 10e–10g). As shown in FIGS. 10e–10g, gold wires may be attached first to the bonding pads 112 of the semiconductor die 110 (FIG. 10e), and then to the inner lead pads 102 of the leads 101 (FIG. 10f) using automated bonding equipment with a flat plate support 1002.

Figure 10H:
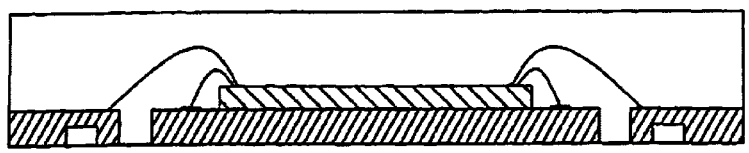

Following attachment of the semiconductor die 110 to the lead frame 100, the pre-assembly may be encapsulated. As shown in FIG. 10h, a liquid encapsulation process or a transfer molding encapsulation process may be used to create packages 10, 20 such as those shown in FIGS. 1–7. Upon completion of this assembly step of a particular assembly process, at least a portion of the outer lead pad 106 of the lead frame 100 may remain exposed to allow electrical connection to a printed circuit board (not shown), another semiconductor die and/or another integrated circuit package.

Figure 10I:
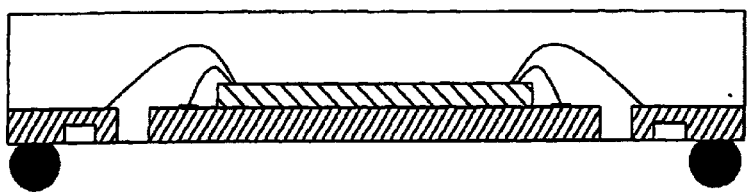

As shown in FIG. 10i, solder balls 117 may then be attached to the outer lead pads 106 of the leads 101 of each lead frame 100 using, for example, a reflow soldering process. Solder balls 117 attached to the exposed portions of the leads 101 may provide a clearance when the package 10, 20 is mounted on a printed circuit board. Such clearance may facilitate cleaning (e.g., cleaning of solder flux).

Figure 10J:
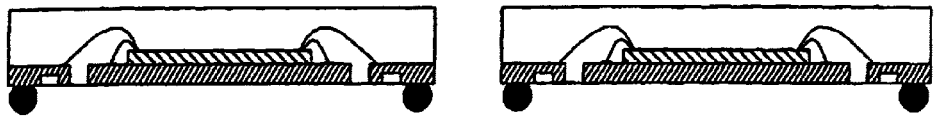

In one example method embodiment of the present invention, after the encapsulation and ball attachment assembly steps, the integrated circuit packages 10, 20 may be singulated into individual units using a saw singulation or punching technique (shown in FIG. 10j). During saw singulation, the strip 800 may be mounted to a wafer saw ring by an adhesive tape and saw-singulated using a conventional wafer saw. Singulation may be guided by alignment targets and other features (labeled as reference 901–904) formed, for example, on a lower surface of the strip 800 (for example, etched or stamped into the lead frame). Such targets or features may be incorporated into the strip 800 during its fabrication, and may help to maintain accurate size tolerances of each integrated circuit package produced in this way. In one example method, the underside of the strip 800 may face upward during a saw singulation process. Once singulated, an individual package 10, 20 may be ready for mounting onto a printed circuit board or other device. Optionally, the strip 800 then may be ink-marked or laser-marked and tin- or solder-plated to facilitate a subsequent board-attachment step.

Although illustrative embodiments and example methods have been shown and described herein in detail, it is to be understood that there may be numerous variations, embodiments, and examples which may be equivalent to those explicitly shown and described. For example, the scope of the present invention may not necessarily be limited in all cases to execution of the aforementioned steps in the order discussed. Unless otherwise specifically stated, the terms and expressions have been used herein as terms and expressions of description, not of limitation. Accordingly, the invention is not to be limited by the specific illustrated and described embodiments and examples (or terms or expressions used to describe them), but only by the scope of the appended claims.

What is claimed is:

1. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead;
a wire attached between said semiconductor die and said inner pad; and
an encapsulant material encapsulating at least a portion of said lead frame,
wherein a length of said wire is about 150 mils or less.

2. The integrated circuit package of claim 1, wherein said connection member is integral with said inner pad.

3. The integrated circuit package of claim 2, wherein said connection member is integral with said outer pad.

4. The integrated circuit package of claim 1, wherein said lead is one of a plurality of inwardly projecting leads, each lead comprising an inner pad, and said inner pad of at least one of said leads projects further inward than another of said inner pads of said leads.

5. The integrated circuit package of claim 1, wherein said lead is one of a plurality of leads, each lead comprising an inner pad and an outer pad, and a distance between adjacent inner pads is less than a distance between adjacent outer pads.

6. The integrated circuit package of claim 1, wherein said encapsulant further encapsulates substantially all of said connection member.

7. The integrated circuit package of claim 1
wherein said connection member is integral with said inner pad and said outer pad;
wherein said connection member has a thickness that is approximately half a thickness of said lead;
wherein said encapsulant further encapsulates substantially all of said connection member; and
wherein a thickness of said inner pad is substantially equal to a thickness of said outer pad.

8. The integrated circuit package of claim 7, wherein said lead is one of a plurality of inward projecting leads, each lead comprising an inner pad, and said inner pad of at least one of said leads projects further inward than another of said inner pads of said leads.

9. The integrated circuit package of claim 7, wherein said lead is one of a plurality of leads, each lead comprising an inner pad and an outer pad, and a distance between adjacent inner pads is less than a distance between adjacent outer pads.

10. The integrated circuit package of claim 7, wherein said lead is one of a plurality of leads, each lead comprising an inner pad, and a width of at least one inner pad is less than a width of another inner pad.

11. The integrated circuit package of claim 7, further comprising a second semiconductor die electrically coupled with a second inner pad of a second lead.

12. The integrated circuit package of claim 1, wherein said encapsulant material comprises an epoxy-based material.

13. The integrated circuit package of claim 4, further comprising a die attachment pad configured to accommodate a contour defined by said inner pads of said leads.

14. The integrated circuit package of claim 1:
wherein said lead is one of a plurality of inwardly projecting leads, each lead comprising an inner pad, and
wherein said package further comprises a die attachment pad configured to accommodate a contour defined by said inner pads of said leads.

15. The integrated circuit package of claim 1, wherein said lead is one of a plurality of leads, each lead comprising an inner pad and an outer pad, wherein said inner pads are spaced more closely together than said outer pads.

16. The method of claim 1, wherein said encapsulating comprises employing a liquid encapsulating process.

17. The method of claim 1, wherein said encapsulating comprises employing a transfer molding process.

18. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead; and
an encapsulant material encapsulating at least a portion of said lead frame,
wherein said connection member has a thickness that is approximately half a thickness of said lead.

19. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead;
an encapsulant material encapsulating at least a portion of said lead frame; and
a solder member attached to an exposed portion of said outer pad.

20. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead; and
an encapsulant material encapsulating at least a portion of said lead frame,
wherein said lead is one of a plurality of leads, each lead comprising an inner pad, and a width of at least one inner pad is less than a width of another inner pad.

21. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead;
an encapsulant material encapsulating at least a portion of said lead frame; and
a second semiconductor die electrically coupled with a second inner pad of a second lead.

22. An integrated circuit package, comprising:
a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein a thickness of said inner pad is substantially equal to a thickness of said outer pad.

23. An integrated circuit package, comprising:

a lead frame comprising a plurality of inwardly projecting leads, each of said leads comprising an inner pad and an outer pad, wherein a region of said inner pad and a region of said outer pad is separated by a channel extending through a width of said lead and connected by a connection member integral with said inner pad and said outer pad, said connection member having a thickness that is approximately half a thickness of said lead;

a semiconductor die electrically coupled with said inner pad of said lead; and an encapsulant material encapsulating at least a portion of said lead frame.

24. The integrated circuit package of claim 23, wherein a portion of said outer pad is exposed.

25. A method, comprising:

providing a matrix of lead frames, each of said lead frames comprising a lead;

forming a channel extending through a width of said lead to create an inner pad, an outer pad and a connection member in said lead;

electrically coupling a semiconductor die with said inner pad;

encapsulating at least a portion of said lead frame; and singulating said matrix to form a plurality of packages.

26. The method of claim 25, wherein said singulating comprises a saw singulation.

27. The method of claim 25, wherein said lead frames are substantially identical.

28. A method, comprising:

providing a lead frame comprising a lead;

forming a channel extending through a width of said lead to create an inner pad, an outer pad and a connection member in said lead;

electrically coupling a semiconductor die with said inner pad; and encapsulating at least a portion of said lead frame, wherein said forming comprises etching said channel into said lead.

29. The method of claim 28, wherein said etching comprises a chemical etching process.

30. The method of claim 28, wherein said etching comprises etching said channel to a thickness of approximately half a thickness of said lead.

31. A method, comprising:

providing a lead frame comprising a lead;

forming a channel extending through a width of said lead to create an inner pad, an outer pad and a connection member in said lead;

electrically coupling a semiconductor die with said inner pad;

encapsulating at least a portion of said lead frame; and attaching a solder member to said outer pad.

32. A method, comprising:

providing a lead frame comprising a lead;

forming a channel extending through a width of said lead to create an inner pad, an outer pad and a connection member in said lead;

electrically coupling a semiconductor die with said inner pad; and encapsulating at least a portion of said lead frame, wherein said electrically coupling comprises attaching a wire between said semiconductor die and said inner pad by a thermo-sonic bonding process.

33. The method of claim 32, wherein said bonding process comprises attaching said wire to a top side of said inner pad while a support contacts a bottom side of said inner pad and a bottom side of said outer pad.

34. The method of claim 33, wherein said support is a substantially flat plate.

35. A lead frame, comprising:

a lead comprising an inner pad and an outer pad connected by a connection member, wherein a region of said inner pad and a region of said outer pad are separated by a channel extending through a width of said lead, wherein a thickness of said inner pad is substantially equal to a thickness of said outer pad.

36. The lead frame of claim 35, wherein said connection member has a thickness that is approximately half a thickness of said lead.

37. The lead frame of claim 35, wherein said connection member is integral with said inner pad.

38. The lead frame of claim 37, wherein said connection member is integral with said outer pad.

39. The lead frame of claim 35, wherein said lead is one of a plurality of inwardly projecting leads, each lead comprising an inner pad, and said inner pad of at least one of said leads projects further inward than another of said inner pads of said leads.

40. The lead frame of claim 35, wherein said lead is one of a plurality of leads, each lead comprising an inner pad and an outer pad, and a distance between adjacent inner pads is less than a distance between adjacent outer pads.

41. The lead frame of claim 35, wherein said lead is one of a plurality of leads, each lead comprising an inner pad, and a width of at least one inner pad is less than a width of another inner pad.

42. The lead frame of claim 35, wherein said lead frame is made of an electrically conductive material.

43. The lead frame of claim 42, wherein said electrically conductive material comprises copper.

44. The lead frame of claim 42, wherein said electrically conductive material comprises a compound.

45. The lead frame of claim 35, wherein a width of said outer pad is about 0.230 mm.

46. The lead frame of claim 45, wherein a length of said outer paid is about 0.550 mm.

47. The lead frame of claim 46, wherein said lead comprises one of a plurality of leads, each lead comprising an outer pad, wherein a pitch of adjacent outer pads is about 0.500 mm.

48. The lead frame of claim 35, wherein said lead is one of a plurality of leads, each lead comprising an inner pad and an outer pad, wherein said inner pads are spaced more closely together than said outer pads.

49. A lead frame, comprising:

a lead comprising an inner pad and an outer pad connected by a connection member, wherein a region of said inner pad and a region of said outer pad are separated by a channel extending through a width of said lead, wherein said connection member has a thickness that is approximately half a thickness of said lead.

50. An integrated circuit package comprising a lead frame, comprising:
a lead comprising a means for connecting an inner pad and an outer pad of said lead, wherein a region of said inner pad and a region of said outer pad are separated by a channel extending through a width of said lead;
a semiconductor die electrically coupled with said inner pad of said lead; and
a wire attached between said semiconductor die and said inner pad, wherein a length of said wire is about 150 mils or less.

51. The integrated circuit package of claim 50, wherein said lead is one of a plurality of inwardly projecting leads, each lead comprising an inner pad, and said inner pad of at least one of said leads projects further inward than another of said inner pads of said leads.

52. The integrated circuit package of claim 50, wherein said lead is one of a plurality of leads, each lead comprising an inner pad and an outer pad, and a distance between adjacent inner pads is less than a distance between adjacent outer pads.

53. The integrated circuit package of claim 50, further comprising an encapsulant material encapsulating at least a portion of said lead frame.

54. The integrated circuit package of claim 53, wherein a portion of said outer pad is exposed.

55. The integrated circuit package of claim 53, further comprising a semiconductor die electrically coupled with said inner pad of said lead.

56. The integrated circuit package of claim 53, wherein said encapsulant further encapsulates substantially all of said connection member.

57. The integrated circuit package of claim 50, wherein said lead is one of a plurality of leads, each lead comprising an inner pad, and wherein said package further comprises a plurality of semiconductor dies electrically coupled with said inner pads.

58. The integrated circuit package of claim 50,
wherein said lead is one of a plurality of inwardly projecting leads, each lead comprising an inner pad, and
wherein said package further comprises a die attachment pad configured to accommodate a contour defined by said inner pads of said leads.

59. An integrated circuit package comprising a lead frame, comprising:
a lead comprising a means for connecting an inner pad and an outer pad of said lead, wherein a region of said inner pad and a region of said outer pad are separated by a channel extending through a width of said lead, and
wherein said lead is one of a plurality of leads, each lead comprising an inner pad, and a width of at least one inner pad is less than a width of another inner pad.

60. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead; and
an encapsulant material encapsulating at least a portion of said lead frame,
wherein a portion of said outer pad is exposed.

61. An integrated circuit package comprising a lead frame, comprising:
a lead comprising a means for connecting an inner pad and an outer pad of said lead, wherein a region of said inner pad and a region of said outer pad are separated by a channel extending through a width of said lead, and
wherein a thickness of said inner pad is substantially equal to a thickness of said outer pad.

62. A lead frame, comprising:
a lead comprising an inner pad and an outer pad connected by a connection member, wherein a region of said inner pad and a region of said outer pad are separated by a channel extending through a width of said lead, and
wherein said lead is one of a plurality of leads, each lead comprising a connection member, and wherein at least two of said connection members have different lengths.

63. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead; and
an encapsulant material encapsulating at least a portion of said lead frame,
wherein said lead is one of a plurality of leads, each lead comprising a connection member, and wherein at least two of said connection members have different lengths.

64. An integrated circuit package, comprising:
a lead frame comprising a lead comprising an inner pad and an outer pad connected by a connection member, wherein a region of said inner pad and a region of said outer pad are separated by a channel extending through a width of said lead;
a semiconductor die electrically coupled with said inner pad of said lead;
an encapsulant material encapsulating at least a portion of said lead frame; and
a die attachment pad, wherein at least a portion of said die attachment pad is exposed.

65. The integrated circuit package of claim 64, wherein said die attachment pad and said semiconductor die are attached by a soft solder.

66. The integrated circuit package of claim 64, wherein at least a portion of said outer pad is exposed.

67. The integrated circuit package of claim 66, wherein at least a portion of said inner pad is exposed.

68. An integrated circuit package comprising a lead frame, comprising:
a lead comprising a means for connecting an inner pad and an outer pad of said lead, wherein a region of said inner pad and a region of said outer pad are separated by a channel extending through a width of said lead; and
a die attachment pad, wherein at least a portion of said die attachment pad is exposed.

69. The integrated circuit package of claim 68, wherein at least a portion of said outer pad is exposed.

70. The integrated circuit package of claim 69, wherein at least a portion of said inner pad is exposed.

71. An integrated circuit package, comprising:
a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein said lead frame is pre-plated with palladium.

72. An integrated circuit package, comprising:

a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein at least a portion of an upper and a lower surface of said lead are plated with solder.

73. An integrated circuit package, comprising:

a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein at least a portion of an upper and a lower surface of said lead are plated with tin.

74. An integrated circuit package, comprising:

a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein said lead is one of a plurality of leads, each lead comprising an inner pad and an outer pad, wherein said outer pads are arranged in a generally angular configuration.

75. The integrated circuit package of claim 74, wherein said inner pads are arranged in a generally angular configuration.

76. An integrated circuit package, comprising:

a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein said inner pad has a planform area smaller than a planform area of said outer pad.

77. A lead frame, comprising:

a lead comprising an inner pad and an outer pad connected by a connection member, wherein a region of said inner pad and a region of said outer pad are separated by a channel extending through a width of said lead, wherein said inner pad has a planform area smaller than a planform area of said outer pad.

78. An integrated circuit package, comprising:

a lead frame comprising a lead comprising an inner pad and an outer pad connected by a connection member, wherein a region of said inner pad and a region of said outer pad are separated by a channel extending through a width of said lead;

a semiconductor die electrically coupled with said inner pad of said lead; and an encapsulant material encapsulating at least a portion of said lead frame, wherein said semiconductor die is one of a plurality of semiconductor dies.

79. The integrated circuit package of claim 78, further comprising a die attachment pad attached to said plurality of semiconductor dies.

80. A method, comprising:

providing a matrix of lead frames, each of said lead frames comprising a lead;

forming a channel extending through a width of said lead to create an inner pad, an outer pad and a connection member in said lead;

electrically coupling a semiconductor die with said inner pad; and encapsulating at least a portion of said lead frame, wherein said matrix of lead frames is one of a plurality of matrices of lead frames formed in a frame area of a strip.

81. The method of claim 80, wherein a periphery of said strip comprises an assembly feature for use in automated assembly equipment.

82. The method of claim 81, wherein said assembly feature comprises an alignment target.

83. The method of claim 81, wherein said assembly feature comprises a tooling hole.

84. A method, comprising:

creating a lead from a sheet; and forming a channel extending through a width of said lead to create an inner pad, an outer pad and a connection member in said lead, wherein said creating comprises stamping.

85. The method of claim 84, wherein said sheet comprises a metal.

86. The method of claim 85, wherein said metal comprises copper.

87. The method of claim 84, wherein said creating further comprises creating a plurality of leads in a generally annular configuration, each lead comprising an inner pad, an outer pad and a connection member.

88. The method of claim 87, wherein said creating further comprises creating a die attachment pad.

89. The method of claim 88, further comprising mounting a semiconductor die on said die attachment pad.

90. The method of claim 89, further comprising mounting a second semiconductor die on said die attachment pad.

91. A method, comprising:

creating a lead from a sheet; and forming a channel extending through a width of said lead to create an inner pad, an outer pad and a connection member in said lead, wherein said forming comprises etching said channel into said lead.

92. The method of claim 91, wherein said etching comprises a chemical etching process.

93. The method of claim 91, wherein said etching comprises etching said channel to a thickness of approximately half a thickness of said lead.

94. The method of claim 92, wherein said chemical etching process comprises masking a portion of said lead.

95. The method of claim 91, wherein said creating further comprises creating a plurality of leads in a generally annular configuration, each lead comprising an inner pad, an outer pad and a connection member.

96. The method of claim 91, wherein said creating further comprises creating a die attachment pad.

97. A method, comprising:

creating a lead from a sheet;

forming a channel extending through a width of said lead to create an inner pad, an outer pad and a connection member in said lead; and electrically coupling a semiconductor die with said inner pad.

98. The method of claim 97, further comprising attaching a solder member to said outer pad.

99. The method of claim 97, wherein said electrically coupling comprises attaching a wire between said semiconductor die and said inner pad by a thermo-sonic bonding process; and wherein said bonding process comprises attaching said wire to a top side of said inner pad while a support contacts a bottom side of said inner pad and bottom side of said outer pad.

* * * * *